United States Patent [19]
Roberts

[11] Patent Number: 5,240,874
[45] Date of Patent: Aug. 31, 1993

[54] SEMICONDUCTOR WAFER PROCESSING METHOD OF FORMING CHANNEL STOPS AND METHOD OF FORMING SRAM CIRCUITRY

[75] Inventor: Martin C. Roberts, Boise, Id.

[73] Assignee: Micron Semiconductor, Inc., Boise, Id.

[21] Appl. No.: 963,725

[22] Filed: Oct. 20, 1992

[51] Int. Cl.$^5$ .................................................. H01L 21/76
[52] U.S. Cl. .......................................... 437/69; 437/28; 437/35; 437/52
[58] Field of Search ............................ 437/35, 28, 69; 148/DIG. 85, DIG. 86

[56] References Cited

U.S. PATENT DOCUMENTS 5,173,438  12/1992  Sandhu .................................. 437/69

FOREIGN PATENT DOCUMENTS

| 59-61185 | 4/1984 | Japan | 437/35 |
| 63-293850 | 11/1988 | Japan | 437/28 |
| 63-308341 | 12/1988 | Japan | 437/69 |
| 1-187923 | 7/1989 | Japan | 437/35 |
| 3-160728 | 7/1991 | Japan | 437/35 |
| 3-175641 | 7/1991 | Japan | 437/35 |

OTHER PUBLICATIONS

Hori, T. "¼-pm LATID (Large Tilt-angle Implanted Drain) Technology for 3.3-V Operation", VLSI Technology Research Laboratory, (1989) pp. 32.4.1–32.4.4 (Japan).

Hori, et al., "A New Submicron MOSFET with LATID Structure", Basic Research Laboratory, pp. 15–16 (Japan), 1988.

Nagatomo, et al., "A High Density 4M DRAM Process Using Folded Bitline Adaptive Side-Wall Isolated Capacitor (FASIC) Cell", LSI R and D Lab., pp. 144–147 (Japan) IEDM 1986.

Sunouchi, et al., "Process Integration for 64M DRAM Using An Asymmetrical Stacked Trench Capacitor (AST) Cell", ULSI Research Center, Toshiba Corp., (1990) pp. 647–650 (Japan).

Fuse, et al., "A Practical Trench Isolation Technology With A Novel Planarization Process", Matsushita Electric Industrial Co., (1987) pp. 732–735.

*Primary Examiner*—George Fourson
*Attorney, Agent, or Firm*—Wells, St. John, Roberts, Gregory & Matkin

[57] ABSTRACT

A semiconductor device isolation method of forming a channel stop in a semiconductor wafer comprises: a) selectively forming field oxide on a semiconductor wafer surface, the field oxide having a bird's beak region and a non-bird's beak region, the bird's beak region laterally extending into a desired region on the wafer; b) masking the bird's beak region and desired region; c) with the masking in place, ion implanting a selected material into the wafer through the non-bird's beak region of the field oxide to define a channel stop implant in the wafer under the non-bird's beak region of the field oxide, such non-bird's beak region implant being conducted at an implant angle along the bird's beak which is less than about 10° from perpendicular relative to the wafer surface; and d) with the masking in place, ion implanting a selected material into the wafer through the bird's beak region of the field oxide to define a channel stop implant in the wafer under and along the bird's beak region of the field oxide, such bird's beak region implant being conducted at an implant angle along the bird's beak region which is greater than about 10° and less than about 40° from perpendicular relative to the wafer surface.

25 Claims, 6 Drawing Sheets

_Fig 5_

_Fig 6_

SEMICONDUCTOR WAFER PROCESSING METHOD OF FORMING CHANNEL STOPS AND METHOD OF FORMING SRAM CIRCUITRY

TECHNICAL FIELD

This invention relates generally to semiconductor device isolation methods in formation of channel stops. This invention also relates to formation of SRAM circuitry.

BACKGROUND OF THE INVENTION

Although metal oxide semiconductor field effect transistor (MOSFETs) are fabricated within a common silicon substrate, they must nevertheless be electrically isolated from one another. They are subsequently interconnected to create specific circuit configurations.

MOSFETs are said to be "self-isolated". That is, as long as their source-substrate and drain-substrate pn junctions are held at reverse bias, drain current is due only to current flow from source to drain through a channel under the gate. However, the metal strips used to interconnect MOS transistors form gates of parasitic MOS transistors, with the oxide beneath them forming an undesired gate oxide. To isolate MOSFETs, therefore, it is necessary to prevent the formation of channels in the field regions. One way to accomplish this is to utilize a comparatively thick field oxide layer. However, as device dimensions continue to shrink, thick field oxide regions become undesirable.

Another technique utilized in isolation of transistors raises the doping beneath the field oxide. Such is typically conducted by ion implantation to create what are commonly referred to in the art as "channel stop implants". The combination of field oxide and a channel stop implant can provide adequate isolation for PMOS, NMOS and oxide-isolated bipolar integrated circuits. However, the formation of channel stops in certain applications is not without difficulties and drawbacks.

Figure 1:
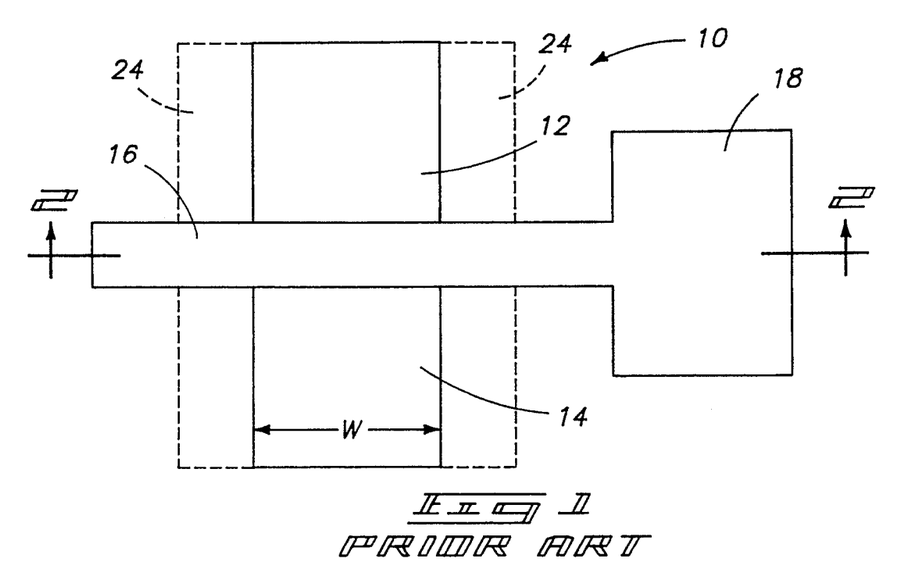
FIG. 1 is a top plan view of prior art circuitry and wafer layout, and is discussed above.
Figure 2:
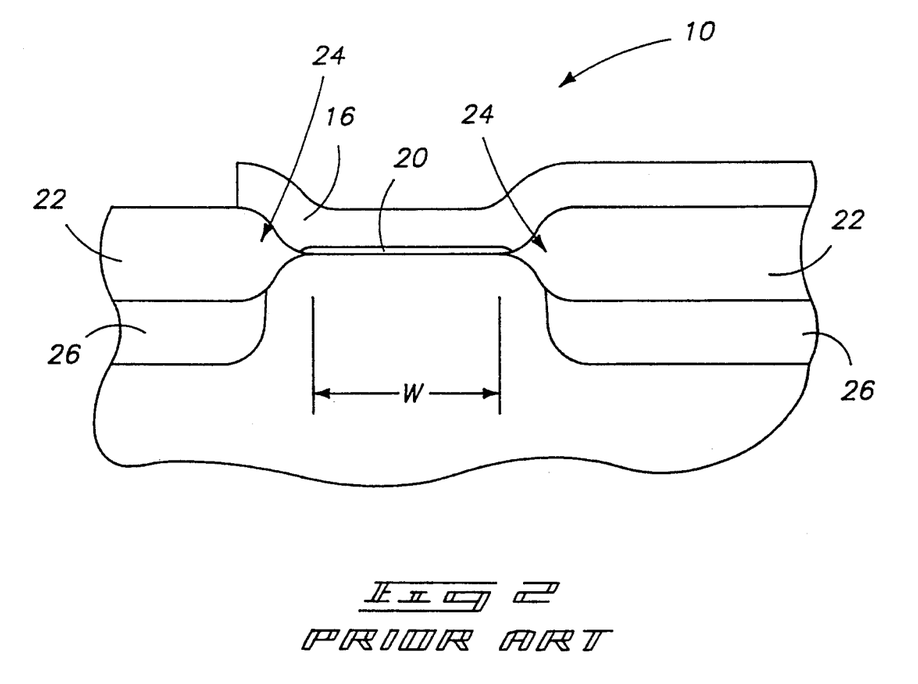
FIG. 2 is a cross sectional view of the FIG. 1 wafer taken along line 2—2 in FIG. 1.

FIG. 1 illustrates a top plan view of a semiconductor wafer illustrating a MOSFET 10. Such is also shown in cross-section in FIG. 2. MOSFET 10 is comprised of opposing source and drain regions 12 and 14 respectively, and a conductive gate 16 extending to an enlarged area 18 for connection/utilization with other components. Active areas 12 and 14 have a common cross-dimension, or width, "W". Gate oxide layer 20 is provided beneath gate 16 (FIG. 2).

Isolating field oxide 22 has been formed, as illustrated. Such regions include the typical bird's beak regions 24 which laterally extend into the region where active areas 12 and 14 are formed. Blocking p-type implants are provided in the area directly beneath the non-bird's beak regions, thus defining what are commonly known as channel stop regions 26.

Figure 3:
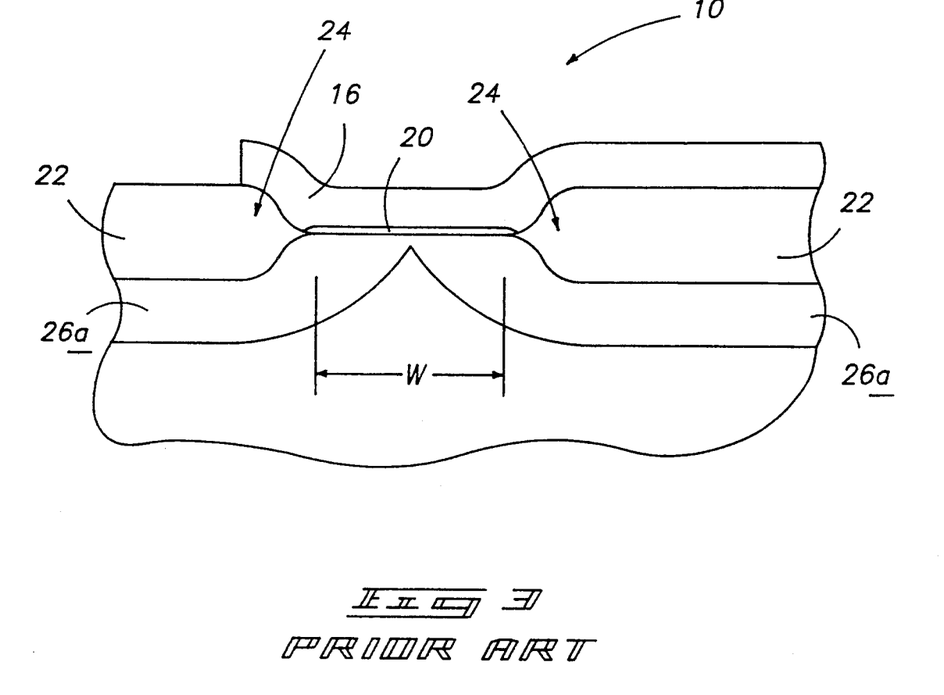
FIG. 3 is a cross sectional view of the FIG. 1 wafer taken along line 2—2 in FIG. 1, illustrating a prior art processing step subsequent to that shown by FIG. 2.

Heating of the semiconductor wafer during processing after forming channel stops 26 can cause the stops to migrate in the direction of active areas 12 and 14, and beneath gate 16, in a manner which cannot easily be controlled. FIG. 3 illustrates a worse case scenario where the channel stop implants have migrated considerably, forming channel stops 26a which results in unacceptably high threshold voltage for the device. In another aspect of the prior art, the desired channel stop implants are formed before field oxide regions 22 are created. However unfortunately this causes the implanted p-type material, typically boron, to segregate into the field oxide at the time the field oxide is formed.

Figure 4:
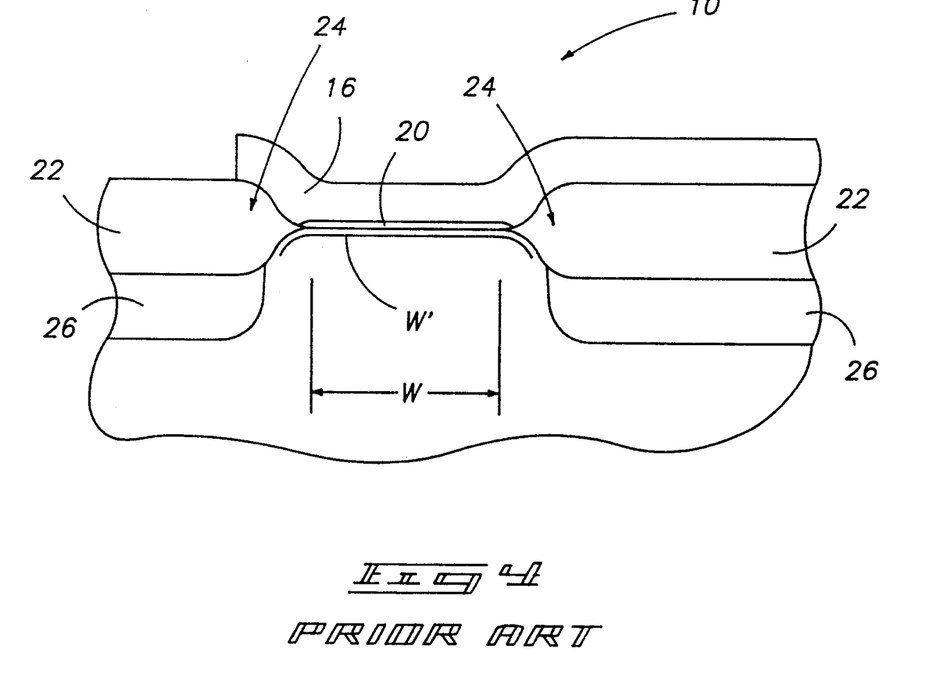
FIG. 4 is a cross sectional view of the FIG. 1 wafer taken along line 2—2 in FIG. 1, illustrating prior art operational considerations.

Referring to FIG. 4, in many applications the width "W" is critical from a design and operation standpoint. For example, design considerations might mandate for purposes of current flow that the active areas being produced have the width "W" within very tight tolerances. However, the effective width of the active area upon energizing gate 16 may be lengthened somewhat as illustrated by curved line W' due to the narrowing beneath the bird's beak and absence of channel stop implant in this area. The length of line W' is greater than that of W, thus current flow is greater with W'. This could significantly adversely affect circuit operation. It would be desired in certain applications to enable the channel stop implants 26 to extend upwardly to the edge or even into the active area in a controllable, repeatable manner to more accurately produce a desired active area width "W".

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with an aspect of the invention, a semiconductor device isolation method of forming a channel stop in a semiconductor wafer comprises the following steps:

selectively forming field oxide on a semiconductor wafer surface, the field oxide having a bird's beak region and a non-bird's beak region, the bird's beak region laterally extending into a desired region on the wafer;

masking the bird's beak region and desired region;

with the masking in place, ion implanting a selected material into the wafer through the non-bird's beak region of the field oxide to define a channel stop implant in the wafer under the non-bird's beak region of the field oxide, such non-bird's beak region implant being conducted at an implant angle along the bird's beak which is less than about 10° from perpendicular relative to the wafer surface; and with the masking in place, ion implanting a selected material into the wafer through the bird's beak region of the field oxide to define a channel stop implant in the wafer under and along the bird's beak region of the field oxide, such bird's beak region implant being conducted at an implant angle along the bird's beak region which is greater than about 10° and less than about 40° from perpendicular relative to the wafer surface.

Figure 5:
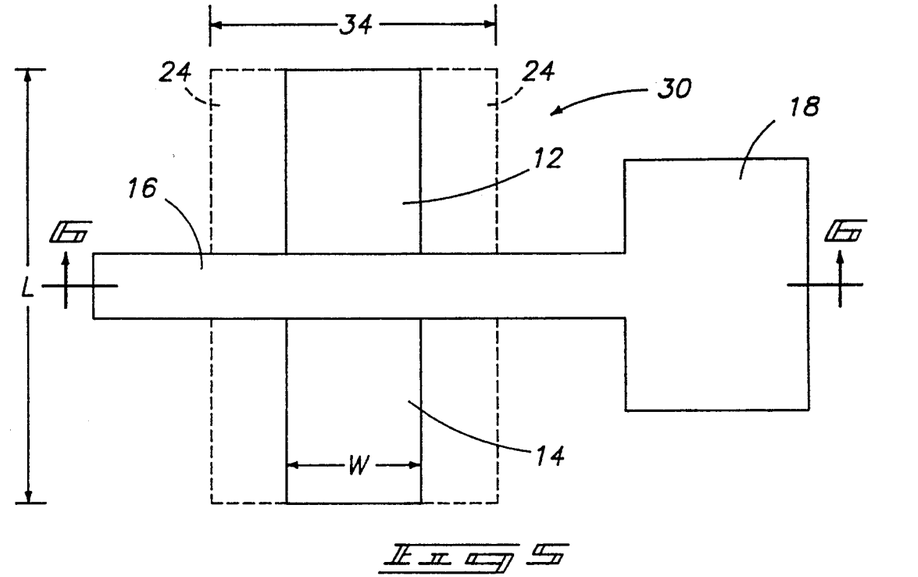
FIG. 5 is a top plan view of prior art circuitry and wafer layout in accordance with the invention.
Figure 6:
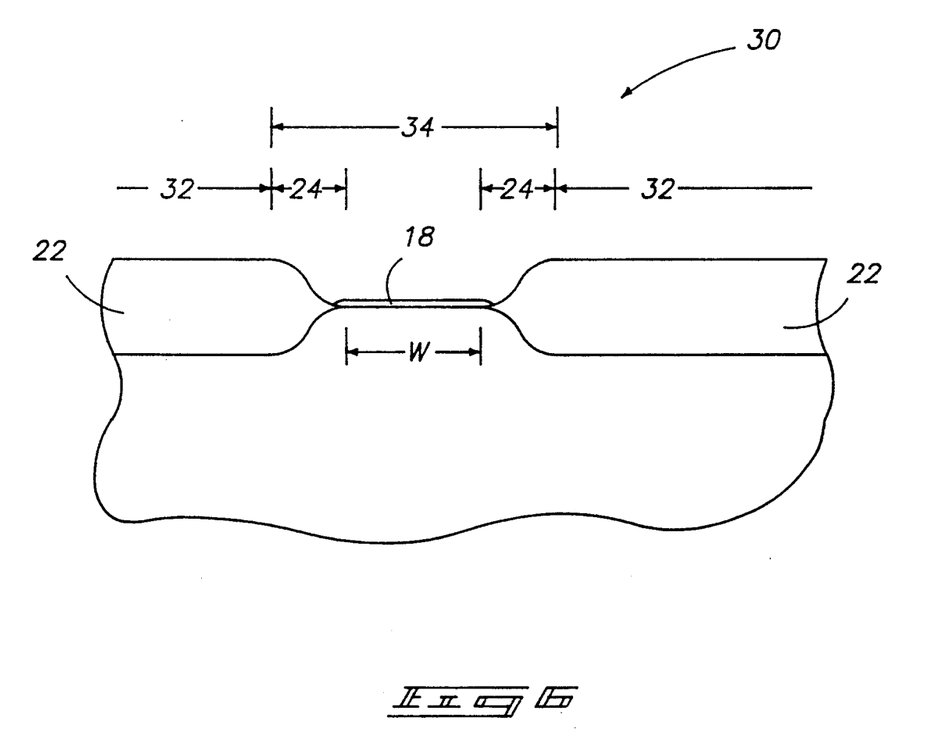
FIG. 6 is a cross sectional diagrammatic view of the FIG. 5 wafer generally taken along line 6—6 in FIG. 5.

More specifically and first with reference to FIGS. 5 and 6, a MOSFET 30 is in the process of being formed. Like numerals in construction are utilized as they were with respect to FIGS. 1–4 of the prior art, such that only differences pertinent to the invention are described below. For purposes of the continuing discussion, field oxide 22 formed on the semiconductor wafer surface has bird's beak regions 24 and non-bird's beak regions 32. Also for purposes of the continuing discussion, field oxide regions 22 define a desired region 34 within which active area and a transistor gate will be provided, with bird's beak regions 24 extending laterally and opposingly into desired region 34. Gate oxide 18 is formed as shown.

FIG. 5 illustrates source and drains 12 and 14 providing an overall active area having width "W" and length "L". Gate 16 is also provided. The discussion proceeds with emphasis or focus on the formation of channel stop implants in accordance with the invention. It is to be understood that such channel stops could be provided either before or after gate and active area formation.

Figure 7:
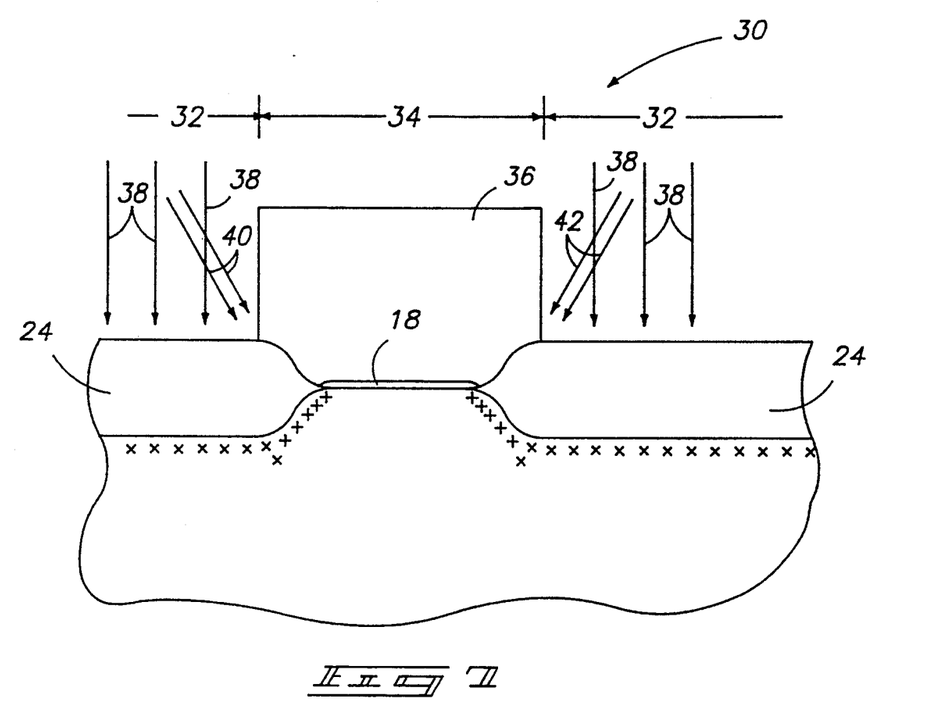
FIG. 7 is a cross sectional diagrammatic view of the FIG. 5 wafer generally taken along line 6—6 in FIG. 5, and showing a processing step subsequent to that shown by FIG. 6.

Referring to FIG. 7, opposing bird's beak regions 24 and desired region 34 are masked with a suitable material, such as photoresist 36. With photoresist mask 36 in place, a selected material is ion-implanted into the wafer through non-bird's beak regions 32 of field oxide 22 to define channel stop implants in the wafer under the non-bird's beak regions of the field oxide, such is as represented by the plurality of "x". Such non-bird's beak regions implant is conducted at an implant angle along the bird's beak regions (into and out of the page) which is less than about 10° from perpendicular relative to the wafer surface, as represented by arrows 38. The illustrated arrows 38 are shown as being exactly perpendicular relative to the wafer surface. Preferably and in accordance with prior art techniques, typical ion implantation into a silicon substrate is conducted at an approximate 5° to 7° angle from perpendicular to the wafer surface. Such is conducted to prevent channeling effects from resulting in the silicon crystal lattice which occur if the implant angle was exactly perpendicular. An example implant material would be boron, implanted at a power from about 120 KeV to 200 KeV at a dose of $1 \times 10^{12}$ to $6 \times 10^{12}$, assuming a non-bird's beak region field oxide thickness of from about 3000 Angstroms to about 4500 Angstroms.

With masking 36 in place, a selected material is ion implanted into the wafer through one of the opposing bird's beak regions 24 of field oxide 22 to define a channel stop implant in the wafer under and along the one bird's beak region of field oxide. Such one bird's beak region implant is conducted at an implant angle along the bird's beak regions (into and out of the page) which is greater than about 10° and less than about 40° from perpendicular relative to the wafer surface. In FIG. 7, such is represented by arrows 40 implanting through the left illustrated bird's beak 24 to produce the plurality of "+" beneath the left bird's beak 24. Preferably, the implant angle is about 20° from perpendicular relative to the wafer surface. Typically and preferably the angled implant material will be the same as the ion implanted material driven through the non-bird's beak region. The preferred material, power, and dose are as described above.

Then in similar fashion, the material is ion implanted into the wafer through the opposing right bird's beak region 24 to define a channel stop implant in the wafer under and along the right bird's beak region. Such implant would typically be conducted at the same implant angle along the bird's beak regions which arrows 24 represented for the left bird's beak region. In FIG. 7, the right birds beak region implant is represented by arrows 42 to produce the illustrated plurality of "+" beneath the right bird's beak 24.

It is believed that any of the implants represented by arrows 38, 40 and 42 could be conducted in any order relative to one another. The angle of implants represented by arrows 40 and 42 also need not be identical to one another, but it is anticipated that this will be the typical method to achieve uniform left and right implants. Also, this aspect of the invention has been described relative to providing angled implants relative to opposing bird's beak field oxide regions. Of course, only one angled implant could be made relative to a single bird's beak field oxide region in accordance with the invention, as represented by the accompanying claims.

Figure 8:
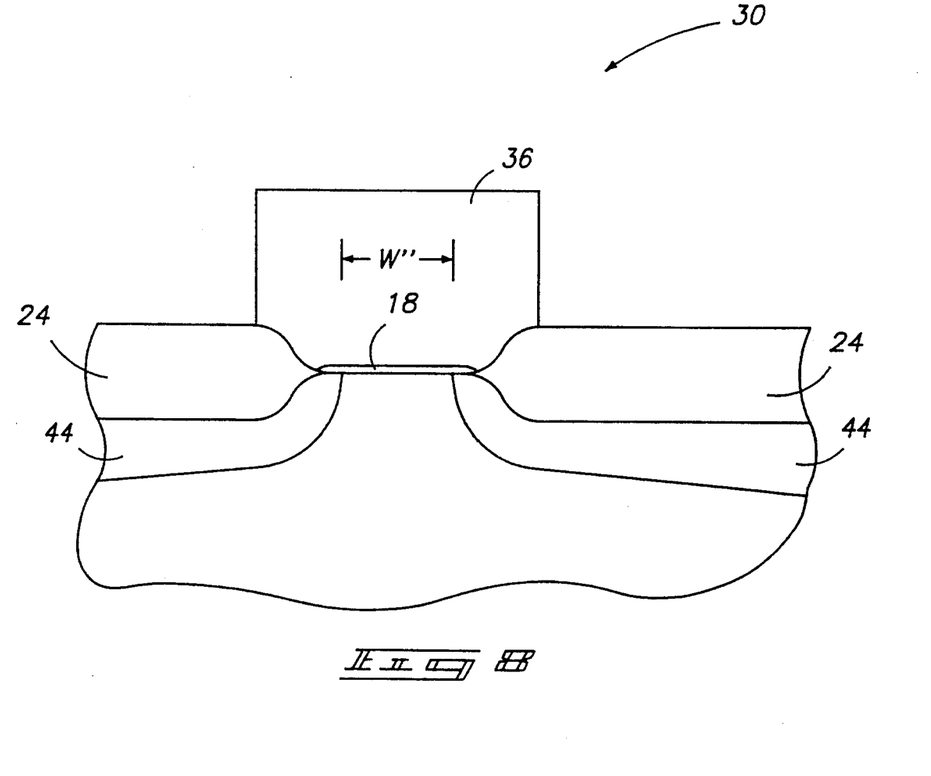
FIG. 8 is a cross sectional diagrammatic view of the FIG. 5 wafer generally taken along line 6—6 in FIG. 5, and showing a processing step in accordance with that shown by FIG. 6.

Referring to FIG. 8, the previously illustrated plurality of "x" and "+" form opposing channel stop implants 44. Such a technique enables repeatable and controllable definition of a desired width "W'''", as illustrated.

Figure 9:
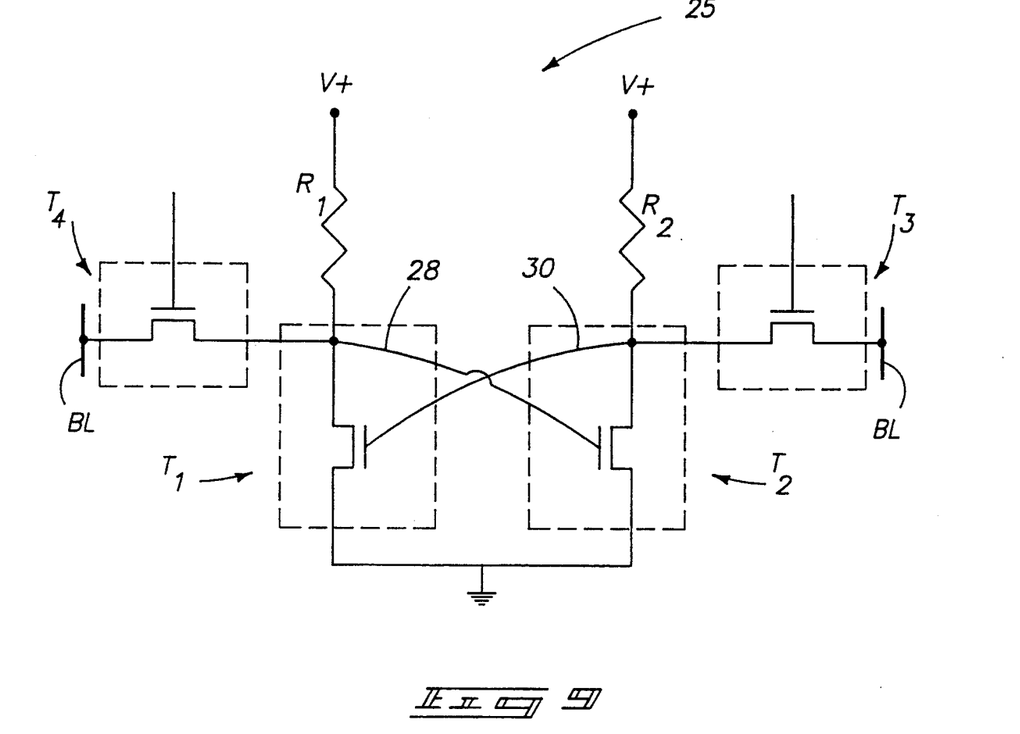
FIG. 9 is a schematic of circuitry in accordance with the invention.

The above described techniques have specific utility in formation of SRAM circuitry where comparative current flow/resistance of various transistors in an SRAM cell can be critical. An example of such a memory cell 25 is shown schematically in FIG. 9. These illustrated is a pair of pull down transistors $T_1$ and $T_2$ which are each series connected with respective biasing resistor $R_1$ and $R_2$ between a bias voltage $V+$ and ground. The respective gates of these transistors are cross-coupled to the respective source or drain of the other respective transistor, as shown by lines 28 and 30. Such cross-coupled gates then connect to active areas of access transistors $T_3$ and $T_4$. One of the active areas of each of the transistors $T_3$ and $T_4$ connects with a respective bit line, represented by "BL".

For proper SRAM operation, it is necessary that the conductance of $T_1$ and $T_2$ be approximately three times as large as that of $T_3$ and $T_4$. Such is typically controlled by the comparative size of the active areas of $T_1$ and $T_2$ and those of $T_3$ and $T_4$. In such instances, it is imperative that the width of the access active area transistors be controlled precisely such that current flow therethrough is at least three times less than current flow through the pull down transistors. Techniques in accordance with this invention facilitate channel stop formation beneath the bird's beak area as desired for the access areas transistors, and prevents such implant beneath the bird's beak area for the pull down device transistors, where current flow is less critical.

Figure 10:
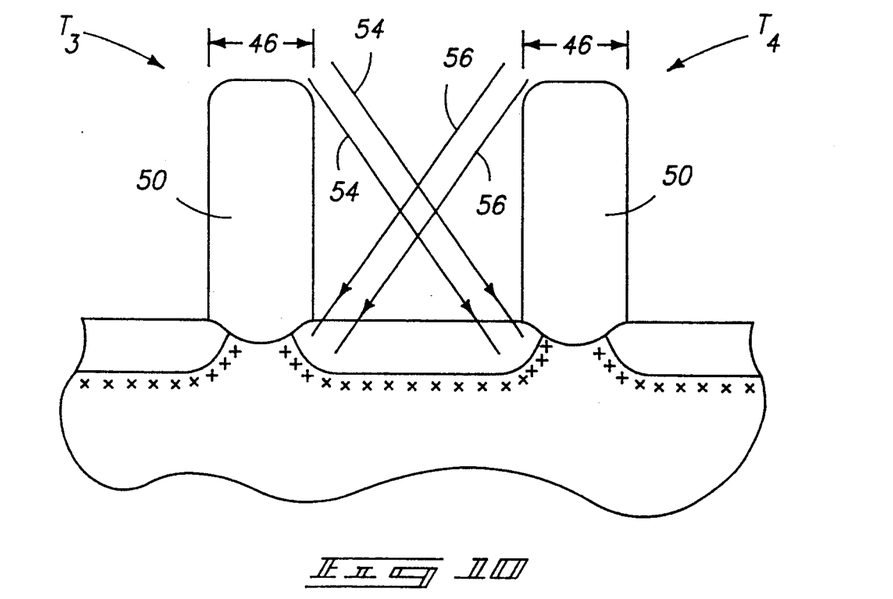
FIG. 10 is a cross sectional view of a semiconductor wafer fragment processed in accordance with the invention.
Figure 11:
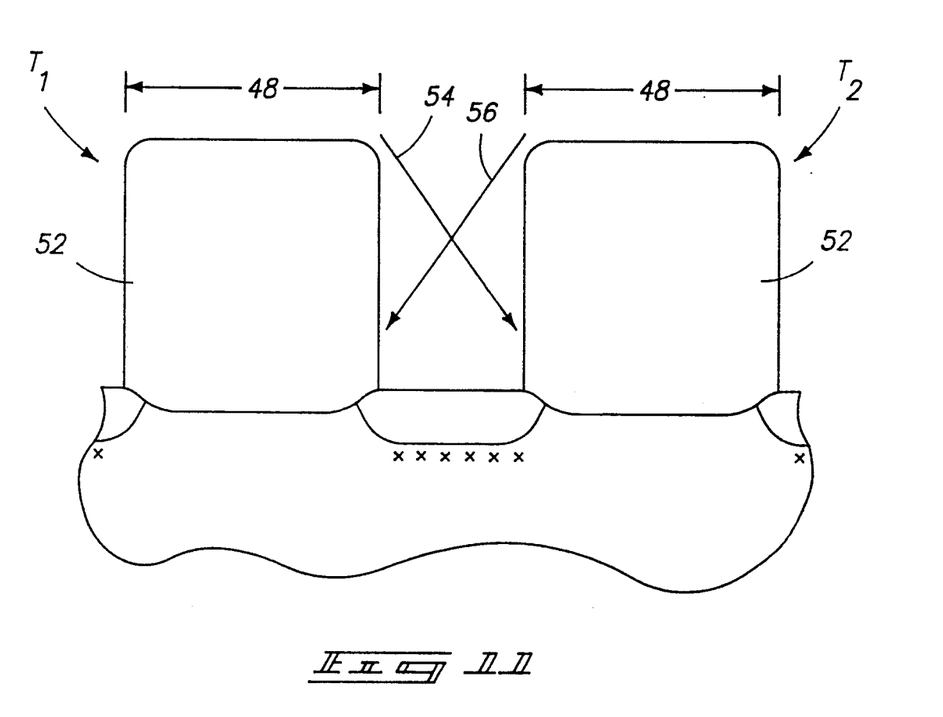
FIG. 11 is a cross sectional view of a semiconductor wafer fragment processed in accordance with the invention.

Such will be understood with reference to FIGS. 10 and 11. Such views are analogous in section to those views of FIGS. 7 and 8. FIG. 10 illustrates a section as would be taken through active areas of access transistors $T_3$ and $T_4$, while FIG. 11 illustrates a section through the wafer as would be taken through the active areas of the pull transistors $T_1$ and $T_2$. Accordingly, FIG. 10 illustrates a pair of desired access transistor regions 46 for formation of access transistor active areas and access transistor gates. FIG. 11 illustrates a pair of desired pull down transistor regions 48 for formation of pull down transistor active areas and pull down transistor gates. The respective regions 46 and 48 have comparative widths represented by that which is shown in FIGS. 10 and 11. Each region 46 and 48 would as well have a length (which would be into and out of the page) which would be longer than its respective width. Note that as shown, the access transistor regions and pull down transistor regions are substantially parallel oriented relative to one another. That is, their length and width dimensions are substantially in parallel relationship. Also note that the width of the access transistor regions 46 is less than the width of the pull down transistor regions 48. Note also, that the access transistor regions 46 are farther apart from one another than are the pull down transistor regions 48 from one another. That is, the distance between the right edge of left access transistor region 46 and the left edge of right access transistor region 46 is greater than the same relative distance between the same respective edges of adjacent regions 48. Respective photoresist masks 50 and 52 mask the opposing bird's beak regions and desired regions 46 and 48, respectively.

Respective angled implants are then ultimately conducted as represented by arrows 54 and 56. However, it is to be noted that the closeness of the larger active areas of $T_1$ and $T_2$ to one another as compared to that of $T_3$ and $T_4$ effectively masks the pull down active areas from any implantation beneath the bird's beak regions during the respective angled implants. Such has the effect of providing active area width reduction channel implants for the access active area transistors, and preventing such implants beneath the bird's beak regions in the pull down devices, where it is desired that current flow be maximized. Such is viewable in FIGS. 10 and 11 by the illustrated "x" and "+".

In some design sequences, the access transistor regions and the pull down transistor regions are not oriented parallel relative to one another as described with reference to FIGS. 10 and 11, but rather are oriented at approximately 90° relative to one another. In such instances, the angled implant should be aligned relative to the length of the bird's beak region of the access area transistors for the implant. With such processing, the 90° angling of the access and pull down transistors relative to one another will effectively mask the pull down devices from having channel implants provided beneath their respective bird's beak regions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor device isolation method of forming a channel stop in a semiconductor wafer, the method comprising the following steps:
   selectively forming field oxide on a semiconductor wafer surface, the field oxide having a bird's beak region and a non-bird's beak region, the bird's beak region laterally extending into a desired region on the wafer;
   masking the bird's beak region and desired region;
   with the masking in place, ion implanting a selected material into the wafer through the non-bird's beak region of the field oxide to define a channel stop implant in the wafer under the non-bird's beak region of the field oxide, such non-bird's beak region implant being conducted at an implant angle along the bird's beak which is less than about 10° from perpendicular relative to the wafer surface; and
   with the masking in place, ion implanting a selected material into the wafer through the bird's beak region of the field oxide to define a channel stop implant in the wafer under and along the bird's beak region of the field oxide, such bird's beak region implant being conducted at an implant angle along the bird's beak region which is greater than about 10° and less than about 40° from perpendicular relative to the wafer surface.

2. The isolation method of forming a channel stop of claim 1 wherein the through the bird's beak implant angle is about 20° from perpendicular relative to the wafer surface.

3. The isolation method of forming a channel stop of claim 1 wherein the through the non-bird's beak implant is conducted before the through the bird's beak implant.

4. The isolation method of forming a channel stop of claim 1 wherein the through the bird's beak implant is conducted before the through the non-bird's beak implant.

5. The isolation method of forming a channel stop of claim 1 wherein the implanted selected material is the same for both the through the non-bird's beak implant and the through the bird's beak implant.

6. A method of forming a transistor in a semiconductor wafer, the method comprising the following steps:
   forming a gate insulator on a semiconductor wafer surface,
   selectively forming field oxide on the semiconductor wafer to define a desired region for formation of active area and a gate, the field oxide having opposing bird's beak regions and non-bird's beak regions, the bird's beak regions laterally and opposingly extending into the desired region;
   providing a transistor gate;
   masking the opposing bird's beak regions and the desired region;
   with the masking in place, ion implanting a selected material into the wafer through the non-bird's beak regions of the field oxide to define channel stop implants in the wafer under the non-bird's beak regions of the field oxide, such non-bird's beak regions implant being conducted at an implant angle along the bird's beak regions which is less than about 10° from perpendicular relative to the wafer surface;

with the masking in place, ion implanting a selected material into the wafer through one of the opposing bird's beak regions of the field oxide to define a channel stop implant in the wafer under and along the one bird's beak region of the field oxide, such one bird's beak region implant being conducted at an implant angle along the bird's beak regions which is greater than about 10° and less than about 40° from perpendicular relative to the wafer surface;

with the masking in place, ion implanting a selected material into the wafer through the other of the opposing bird's beak regions of the field oxide to define a channel stop implant in the wafer under and along the other bird's beak region of the field oxide, such other bird's beak region implant being conducted at an implant angle along the bird's beak regions which is greater than about 10° and less than about 40° from perpendicular relative to the wafer surface; and providing active area in the desired region adjacent the gate.

7. The method of forming a transistor of claim 6 wherein the implant angles of the through the one bird's beak implant and the through the other bird's beak implant are substantially equal.

8. The method of forming a transistor of claim 6 wherein the implant angles of the through the one bird's beak implant and the through the other bird's beak implant are each about 20° from perpendicular relative to the wafer surface.

9. The method of forming a transistor of claim 6 wherein the through the non-bird's beak implant is conducted before each of the through the bird's beak implants.

10. The method of forming a transistor of claim 6 wherein each of the through the bird's beak implants is conducted before the through the non-bird's beak implant.

11. A method of forming an access transistor of an SRAM in a semiconductor wafer, the method comprising the following steps:

forming a gate insulator on a semiconductor wafer surface;

selectively forming field oxide on the semiconductor wafer to define a desired region for formation of active area and a gate, the field oxide having opposing bird's beak regions and non-bird's beak regions, the bird's beak regions laterally and opposingly extending into the desired region;

providing a transistor gate;

masking the opposing bird's beak regions and the desired region;

with the masking in place, ion implanting a selected material into the wafer through the non-bird's beak regions of the field oxide to define channel stop implants in the wafer under the non-bird's beak regions of the field oxide, such non-bird's beak regions implant being conducted at an implant angle along the bird's beak regions which is less than about 10° from perpendicular relative to the wafer surface;

with the masking in place, ion implanting a selected material into the wafer through one of the opposing bird's beak regions of the field oxide to define a channel stop implant in the wafer under and along the one bird's beak region of the field oxide, such one bird's beak region implant being conducted at an implant angle along the bird's beak regions which is greater than about 10° and less than about 40° from perpendicular relative to the wafer surface;

with the masking in place, ion implanting a selected material into the wafer through the other of the opposing bird's beak regions of the field oxide to define a channel stop implant in the wafer under and along the other bird's beak region of the field oxide, such other bird's beak region implant being conducted at an implant angle along the bird's beak regions which is greater than about 10° and less than about 40° from perpendicular relative to the wafer surface; and providing active area in the desired region adjacent the gate.

12. The method of forming an access transistor of an SRAM of claim 11 wherein the implant angles of the through the one bird's beak implant and the through the other bird's beak implant are substantially equal.

13. The method of forming an access transistor of an SRAM of claim 11 wherein the implant angles of the through the one bird's beak implant and the through the other bird's beak implant are each about 20° from perpendicular relative to the wafer surface.

14. The method of forming an access transistor of an SRAM of claim 11 wherein the through the non-bird's beak implant is conducted before each of the through the bird's beak implants.

15. The method of forming an access transistor of an SRAM of claim 11 wherein each of the through the bird's beak implants is conducted before the through the non-bird's beak implant.

16. A method of forming an access transistor and a pull down transistor of an SRAM in a semiconductor wafer, the method comprising the following steps:

forming a gate insulator on a semiconductor wafer surface;

selectively forming field oxide on the semiconductor wafer to define a pair of desired access transistor regions for formation of access transistor active areas and access transistor gates, and to define a pair of desired pull down transistor regions for formation of pull down transistor active areas and pull down transistor gates; the access transistor regions and pull down transistor regions having respective lengths and widths, the respective access and pull down transistor region lengths being longer than their respective widths, the access transistor regions and the pull down transistor regions being substantially parallel oriented relative to one another, the width of the access transistor regions being less than the width of the pull down transistor regions, the access transistors being farther from one another than are the pull down transistors from one another; the field oxide for each of the access transistor regions and pull down transistor regions having opposing bird's beak regions and non-bird's beak regions, the respective access transistor and pull down transistor bird's beak regions laterally and opposingly extending into the respective desired regions;

providing a gate for each of the access transistor and pull down transistor;

masking the opposing bird's beak regions and the desired regions;

with the masking in place, ion implanting a selected material into the wafer through the non-bird's beak regions of the field oxide to define access transistor and pull down transistor channel stop implants in the wafer under the non-bird's beak regions of the field oxide, such non-bird's beak regions implant being conducted at an implant angle along the bird's beak regions which is less than about 10° from perpendicular relative to the wafer surface;

with the masking in place, ion implanting a selected material into the wafer through one of the opposing bird's beak regions of the field oxide adjacent the access transistor region to define a first angled access transistor channel stop implant in the wafer under and along the one access transistor bird's beak region, such one access transistor bird's beak region implant being conducted at an implant angle along the access transistor bird's beak regions which is greater than about 10° and less than about 40° from perpendicular relative to the wafer surface, the closeness of the pair of pull down devices to one another as compared to that of the access devices effectively masking from implanting beneath bird's beak regions of the pull down devices during such first angled implant;

with the masking in place, ion implanting a selected material into the wafer through the other of the opposing bird's beak regions of the field oxide adjacent the access transistor region to define a second angled access transistor channel stop implant in the wafer under and along the other access transistor bird's beak region, such other access transistor bird's beak region implant being conducted at an implant angle along the access transistor bird's beak regions which is greater than about 10° and less than about 40° from perpendicular relative to the wafer surface, the closeness of the pair of pull down devices to one another as compared to that of the access devices effectively masking from implanting beneath bird's beak regions of the pull down devices during such second angled implant; and providing active area in the desired regions adjacent the gates.

17. The method of forming an access transistor and a pull down transistor of an SRAM of claim 16 wherein the implant angles of the first angled implant and the second angled implant are substantially equal.

18. The method of forming an access transistor and a pull down transistor of an SRAM of claim 16 wherein the implant angles of the first angled implant and the second angled implant are each about 20° from perpendicular relative to the wafer surface.

19. The method of forming an access transistor and a pull down transistor of an SRAM of claim 16 wherein the through the non-bird's beak implant is conducted before each of the first and second angled implants.

20. The method of forming an access transistor and a pull down transistor of an SRAM of claim 16 wherein each of the first and second angled implants is conducted before the through the non-bird's beak implant.

21. A method of forming an access transistor and a pull down transistor of an SRAM device in a semiconductor wafer, the method comprising the following steps:

forming a gate insulator on a semiconductor wafer surface;

selectively forming field oxide on the semiconductor wafer to define a pair of desired access transistor regions for formation of access transistor active areas and access transistor gates, and to define a pair of desired pull down transistor regions for formation of pull down transistor active areas and pull down transistor gates; the access transistor regions and pull down transistor regions having respective lengths and widths, the respective access and pull down transistor region lengths being longer than their respective widths, the access transistor regions and the pull down transistor regions being oriented relative to one another at approximately 90°; the field oxide for each of the access transistor regions and pull down transistor regions having opposing bird's beak regions and non-bird's beak regions, the respective access transistor and pull down transistor bird's beak regions laterally and opposingly extending into the respective desired regions;

providing a gate for each of the access transistor and pull down transistor;

masking the opposing bird's beak regions and the desired regions;

with the masking in place, ion implanting a selected material into the wafer through the non-bird's beak regions of the field oxide to define access transistor and pull down transistor channel stop implants in the wafer under the non-bird's beak regions of the field oxide, such non-bird's beak regions implant being conducted at an implant angle along the bird's beak regions which is less than about 10° from perpendicular relative to the wafer surface;

with the masking in place, ion implanting a selected material into the wafer through one of the opposing bird's beak regions of the field oxide adjacent the access transistor region to define a first angled access transistor channel stop implant in the wafer under and along the one access transistor bird's beak region, such one access transistor bird's beak region implant being conducted at an implant angle along the access transistor bird's beak regions which is greater than about 10° and less than about 40° from perpendicular relative to the wafer surface, the approximately 90° angling of the access and pull down transistor regions relative to one another effectively masking from implanting beneath bird's beak regions of the pull down devices during such first angled implant;

with the masking in place, ion implanting a selected material into the wafer through the other of the opposing bird's beak regions of the field oxide adjacent the access transistor region to define a second angled access transistor channel stop implant in the wafer under and along the other access transistor bird's beak region, such other access transistor bird's beak region implant being conducted at an implant angle along the access transistor bird's beak regions which is greater than about 10° and less than about 40° from perpendicular relative to the wafer surface, the approximately 90° angling of the access and pull down transistor regions relative to one another effectively masking from implanting beneath bird's beak regions of the pull down devices during such second angled implant; and providing active area in the desired regions adjacent the gates.

22. The method of forming an access transistor and a pull down transistor of an SRAM of claim 21 wherein the implant angles of the first angled implant and the second angled implant are substantially equal.

23. The method of forming an access transistor and a pull down transistor of an SRAM of claim 21 wherein the implant angles of the first angled implant and the second angled implant are each about 20° from perpendicular relative to the wafer surface.

24. The method of forming an access transistor and a pull down transistor of an SRAM of claim 21 wherein the through the non-bird's beak implant is conducted before each of the first and second angled implants.

25. The method of forming an access transistor and a pull down transistor of an SRAM of claim 21 wherein each of the first and second angled implants is conducted before the through the non-bird's beak implant.

* * * * *